(12) United States Patent
Kondo

(10) Patent No.: US 11,233,505 B2
(45) Date of Patent: Jan. 25, 2022

(54) DRIVE CIRCUIT FOR SWITCH

(71) Applicant: DENSO CORPORATION, Kariya (JP)

(72) Inventor: Yohei Kondo, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 17/181,339

(22) Filed: Feb. 22, 2021

(65) Prior Publication Data

US 2021/0175884 A1 Jun. 10, 2021

Related U.S. Application Data

(63) Continuation of application No. PCT/JP2019/030428, filed on Aug. 2, 2019.

(30) Foreign Application Priority Data

Aug. 30, 2018 (JP) .............................. JP2018-162027

(51) Int. Cl.
| | |
|---|---|
| *H03B 1/00* | (2006.01) |
| *H03K 3/00* | (2006.01) |
| *H03K 17/16* | (2006.01) |
| *H02M 1/08* | (2006.01) |
| *H02M 7/5387* | (2007.01) |
| *H02P 27/06* | (2006.01) |

(52) U.S. Cl.
CPC ............ *H03K 17/165* (2013.01); *H02M 1/08* (2013.01); *H02M 7/53871* (2013.01); *H02P 27/06* (2013.01)

(58) Field of Classification Search
CPC .... H03K 17/165; H03K 17/687; H03K 17/16; H02M 1/08; H02M 7/53871; H02M 1/00; H02P 27/06
USPC ......................................................... 327/109
See application file for complete search history.

(56) References Cited

U.S. PATENT DOCUMENTS

| | | | | |
|---|---|---|---|---|
| 2012/0025875 A1* | 2/2012 | Kuta | ....................... | H02M 1/32 327/109 |
| 2013/0229209 A1 | 9/2013 | Miyauchi et al. | | |

* cited by examiner

*Primary Examiner* — Metasebia T Retebo
(74) *Attorney, Agent, or Firm* — Oliff PLC

(57) ABSTRACT

A switch drive circuit is provided with a surge detecting unit that detects a surge voltage produced in response to a change in a switching state of the switch; an adjusting unit that adjusts, based on the surge voltage detected by the surge detecting unit, a switching speed of the switch when changing the switching state of the switch; and a mask processing unit that prevents a voltage, detected by the surge voltage detecting unit in a period other than a period where the surge voltage is assumed to be produced in response to a change in the switching state of the switch, from being used by the adjusting unit for adjusting the switching speed.

8 Claims, 13 Drawing Sheets

FIG.6A SGL
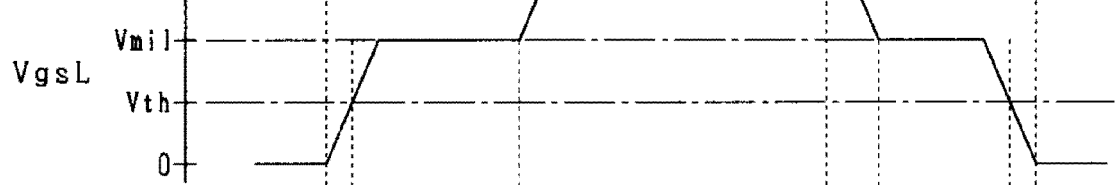
FIG.6B VgsL
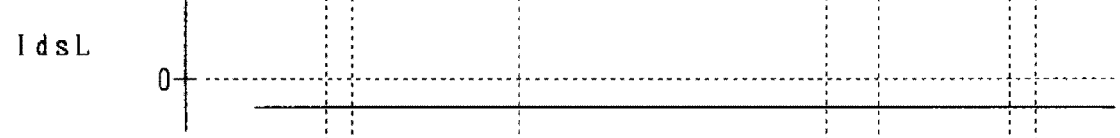
FIG.6C IdsL
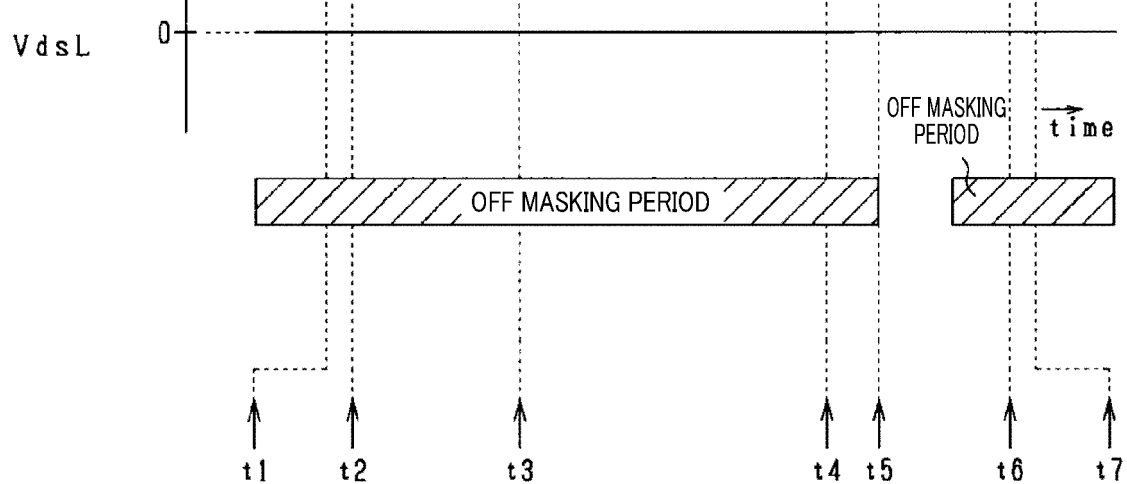
FIG.6D VdsL

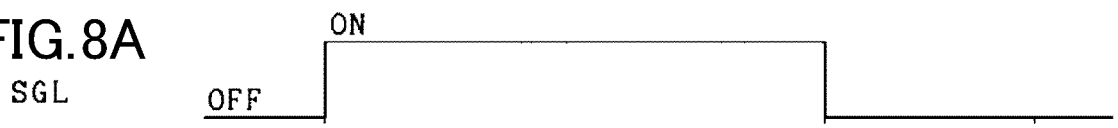
FIG.8A SGL
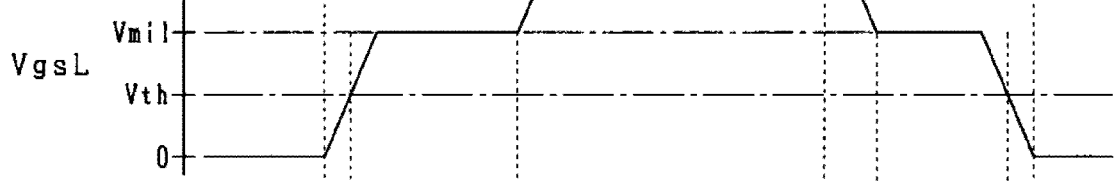
FIG.8B VgsL
FIG.8C IdsL
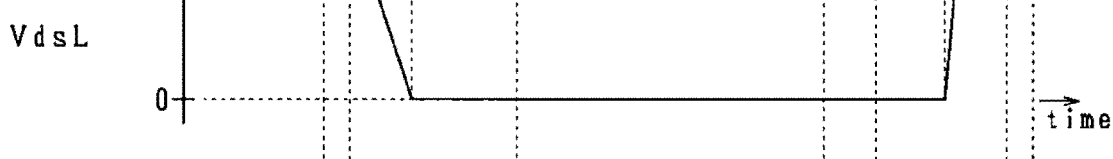
FIG.8D VdsL

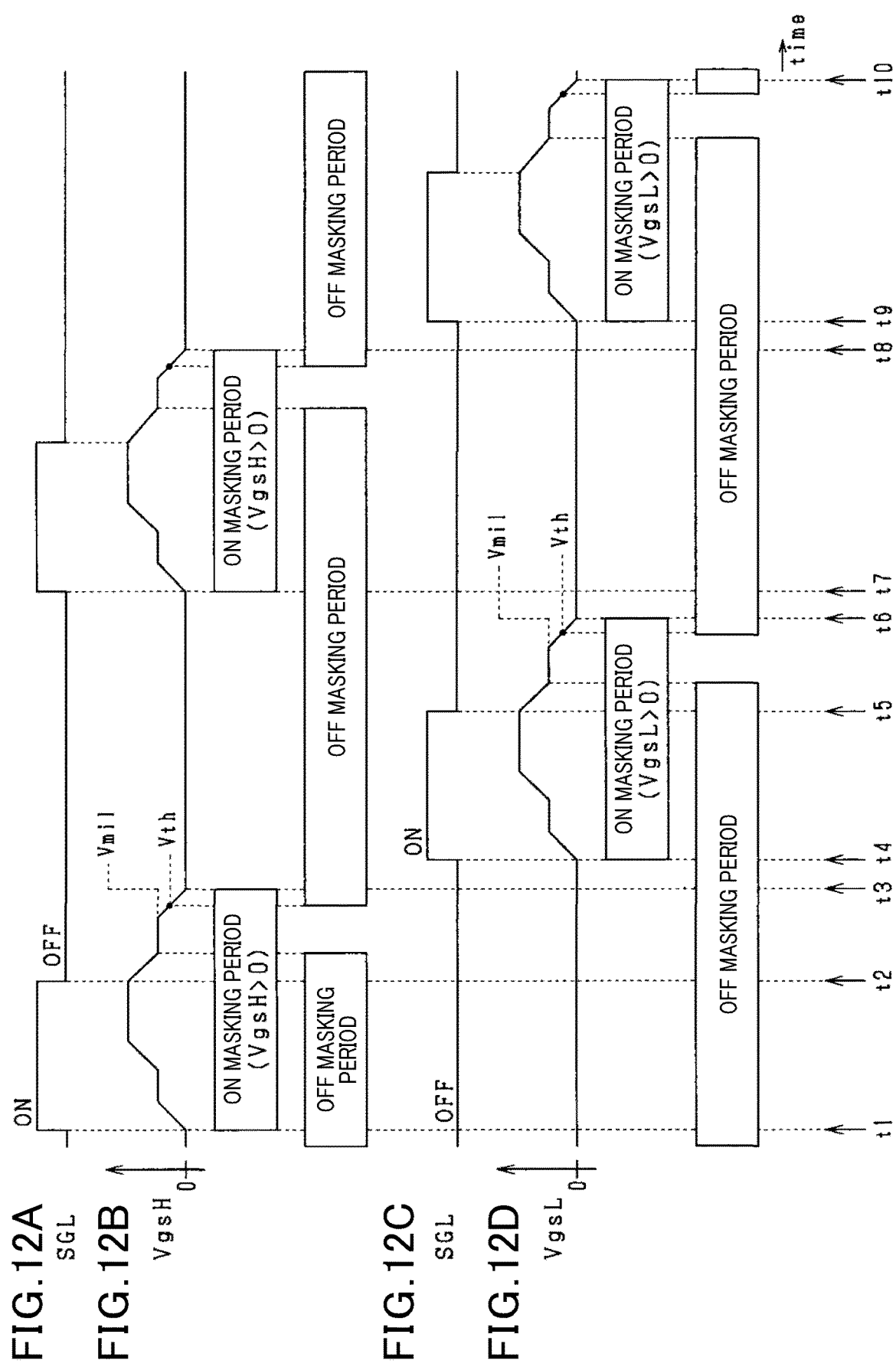

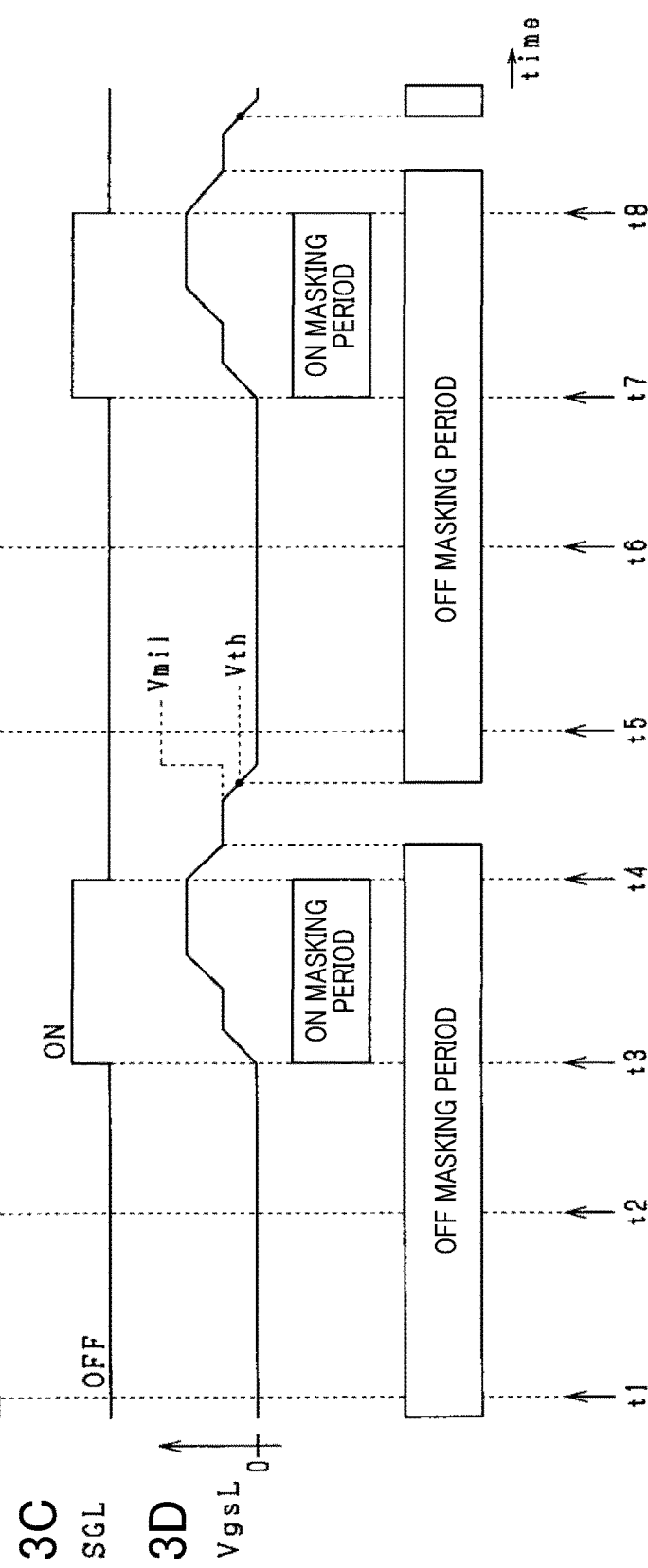

DRIVE CIRCUIT FOR SWITCH

CROSS REFERENCE TO RELATED APPLICATION

This application is the U.S. bypass application of International Application No. PCT/JP2019/030428 filed Aug. 2, 2019 which designated the U.S. and claims priority to Japanese Patent Application No. 2018-162027 filed on Aug. 30, 2018, the contents of which are incorporated herein by reference.

BACKGROUND

Technical Field

The present disclosure relates to a drive circuit for switch.

Description of the Related Art

Conventionally, in the case where a switching state of the switch is changed, a drive circuit provided with an adjusting function that adjusts the switching speed of the switch is known.

SUMMARY

The present disclosure provides a switch drive circuit including a surge detecting unit that detects a surge voltage produced in response to a change in a switching state of the switch; an adjusting unit that adjusts, based on the surge voltage detected by the surge detecting unit, a switching speed of the switch when changing the switching state of the switch; and a mask processing unit that prevents a voltage, detected by the surge voltage detecting unit in a period other than a period where the surge voltage is assumed to be produced in response to a change in the switching state of the switch, from being used by the adjusting unit for adjusting the switching speed.

BRIEF DESCRIPTION OF THE DRAWINGS

The detailed description below with reference to the attached drawings will clarify the above-described object, other objects, features and advantages of the present disclosure.

In the accompanying drawings:

FIGS. 6A to 6D are a set of timing diagrams showing an off-masking period according to a modification of the second embodiment;

FIGS. 8A to 8D are a set of timing diagrams showing an off-masking period;

FIGS. 12A to 12D are a set of timing diagram showing an off-masking period and an on-masking period; and FIGS. 13A to 13D are a set of timing diagram showing an off-masking period and an on-masking period according to a modification of the fourth embodiment.

DETAILED DESCRIPTION OF THE PREFERRED EMBODIMENTS

Conventionally, in the case where a switching state of the switch is changed, a drive circuit provided with an adjusting function that adjusts the switching speed of the switch is known. For example, JP-A-2013-183600 discloses a drive circuit configured to adjust the switching speed based on the current flowing through the switch or the change rate of the current. Thus, the switching loss is reduced while suppressing a surge voltage produced in response to a change in the switching state.

There is a drive circuit using a surge voltage produced in response to a change in the switching state of the switch instead of using the current flowing through the switch or the change rate of the current as a parameter for adjusting the switching speed. In this drive circuit, there is a concern that a drive circuit may operate incorrectly due to erroneous detection of the surge voltage such that the switching speed significantly deviates from the correct switching speed. In this case, the reliability of the switch may be degraded.

With reference to the drawings, embodiments of the present disclosure will be described.

First Embodiment

Hereinafter, a first embodiment in which a drive circuit according to the present disclosure is embodied will be described with reference to the drawings. A drive apparatus according to the present embodiment is mounted on a vehicle.

Figure 1:
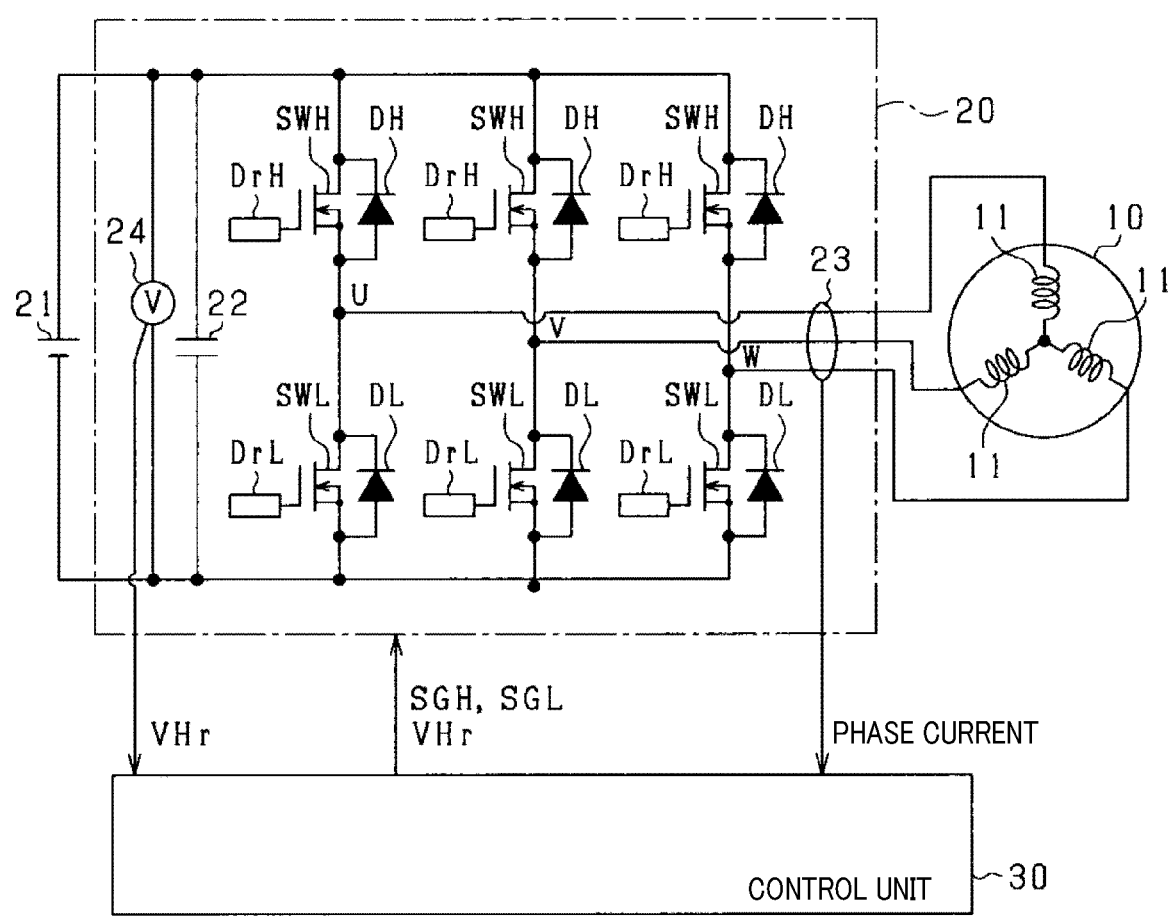
FIG. 1 is an overall configuration diagram of a control system of a rotary electric machine according to a first embodiment of the present disclosure.

As shown in FIG. 1, the control system is provided with a rotary electric machine 10, an inverter 20 and a control unit 30 of which a control object is the rotary electric machine 10. According to the present embodiment, the rotary electric machine 10 is provided with a star-connected three-phase winding 11. The rotor of the rotary electric machine 10 is connected to the driving wheels of the vehicle, the motive force being transmittable therebetween. The rotary electric machine 10 is, for example, a synchronous machine.

The rotary electric machine 10 is connected to a DC power source 21 via the inverter 20. According to the present embodiment, the DC power source 21 is configured as a storage battery. Note that a smoothing capacitor 22 is provided between the DC power source 21 and the inverter 20.

The inverter 20 is provided with a series-connected unit composed of an upper arm switch SWH and a lower arm switch SWL for respective U, V, W phases. According to the present embodiment, as each switch SWH and SWL, a SiC N-channel MOSFET as a unipolar element is utilized. The upper arm switch SWH includes an upper arm diode DH as a body diode, and the lower arm switch SWL includes a lower arm switch DL as a body diode. In the respective switches SWH and SWL of the present embodiment, the drain corresponds to a first main terminal and the source corresponds to a second main terminal.

In the respective phases, a first end of the winding 11 of the rotary electric machine is connected to a connection point between the source of the upper arm switch SWH and the drain of the lower arm switch SWL. The second ends of the windings 11 of respective phases are tied each other at a neutral point.

The control system is provided with a phase current detecting unit 23, and a power source voltage detecting unit 24. The phase current detecting unit 23 detects current for at least two phases in the respective phase current flowing through the rotary electric machine 10. The power source voltage detecting unit 24 detects the terminal voltage of the smoothing capacitor 22 to be a power source voltage VHr. The detection values of the respective detecting units 23 and 24 are transmitted to the control unit 30.

The control unit 30 controls the inverter 20 such that the control variable of the rotary electric machine 10 becomes corresponding command value. The control variable is, for example, a torque. The control unit 30 outputs, in order to make the upper/lower arm switches alternately ON with a dead time therebetween, the upper/lower arm drive signals SGH and SGL corresponding to the upper/lower arm switches SWH and SWL to the upper/lower drive circuits DrH and DrL independently provided for the upper/lower arm switches SWH and SWL. Each of the drive signals serves as either an ON command that commands switching to the ON state, or an OFF command that commands switching to the OFF state. Note that functions provided by the upper/lower arm drive circuits DrH and DrL can be provided by software stored in a tangible memory device, a computer executing the software and hardware, or a combination thereof.

Figure 2:
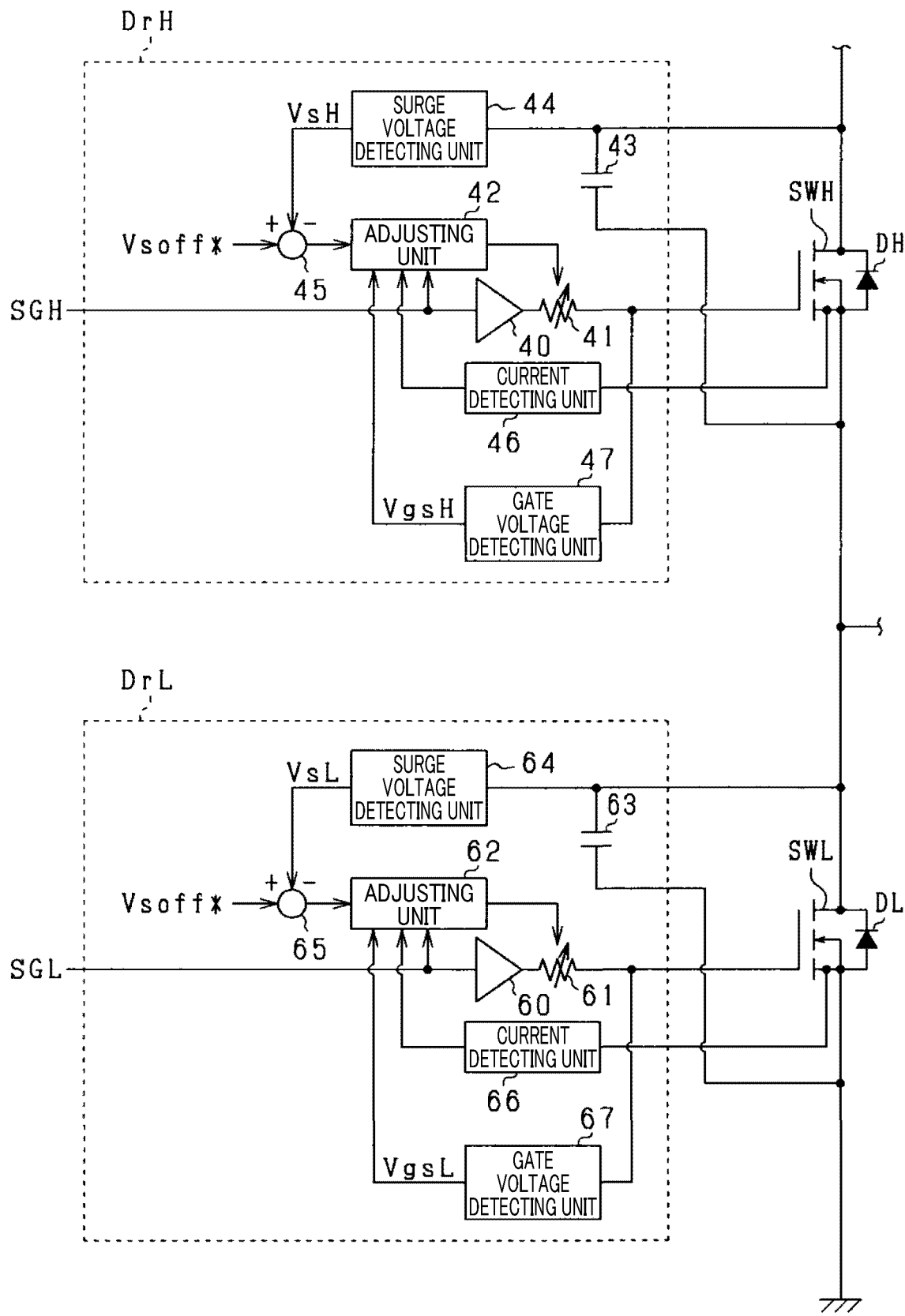
FIG. 2 is a diagram showing a configuration of a drive circuit.

Next, with reference to FIG. 2, a drive circuit will be described.

Firstly, the upper drive circuit DrH will be described. The upper arm drive circuit DrH is provided with a first buffer circuit 40 and a first gate resistor 41. The first gate resistor 41 is configured to have a variable resistance. The first buffer circuit 40 acquires the upper drive signal SGH from the control unit 30, and supplies a charge current to the gate of the upper arm switch SWH via the first gate resistor 41, when the acquired upper arm drive signal SGH indicates an ONcommand. Thus, the gate voltage of the upper arm switch SWH (i.e. voltage difference between the drain and the source) becomes larger than or equal to the threshold voltage Vth and the upper arm switch SWH turns ON. On the other hand, when the acquired upper arm drive signal SGH indicates an OFF command, the first buffer circuit 40 discharges the discharge current from the gate of the upper arm switch SWH via the first gate resistor 41. Thus, the gate voltage of the upper arm switch SWH is less than the threshold voltage Vth and the upper arm switch SWH turns OFF.

The upper arm drive circuit DrH is provided with a first adjusting unit 42, a first capacitor 43, a first surge voltage detecting unit 44 and a first OFF deviation calculation unit 45. The first capacitor 43 is connected in parallel to the upper arm switch SWH. The first surge voltage detecting unit 44 detects, based on the voltage across the terminals of the first capacitor 43, a surge voltage produced in response to the upper arm switch SWH switching to the OFF state (e.g. peak value of the surge voltage), to be the upper arm surge voltage VsH. Note that the first surge voltage detecting unit 44 may be configured to detect a value in which the voltage across the terminals of the smoothing capacitor 22 is subtracted from the above-described surge voltage (e.g. peak value of the above-described surge voltage) to be the upper arm surge voltage VsH. Here, for the voltage across the terminals of the smoothing capacitor 22, for example, the voltage across the terminals of the first capacitor 43 when the upper arm switch SWH is turned OFF, or the power source voltage VHr detected by the power source voltage detecting unit 24 may be used.

The first OFF deviation calculation unit 45 is configured to calculate an upper arm voltage deviation ΔSHoff by subtracting the detected upper arm surge voltage VsH from the off surge command value Vsoff*. The first adjusting unit 42 adjusts, based on the calculated upper arm off voltage deviation ΔSHoff, the resistance of the first gate resistor 41 at a time when the upper switch SWH is turned OFF.

For the first adjusting unit 42, for example, in the case where the upper arm off voltage deviation ΔSHoff is smaller than 0, the first adjusting unit 42 sets the resistance value at a time when the absolute value of the upper arm off voltage deviation ΔSHoff is large, to be larger than the resistance value at a time when the absolute value of the upper arm off voltage deviation ΔSHoff is small. Thus, the discharge current discharged from the gate when the absolute value of the upper arm off voltage deviation ΔSHoff is large, becomes smaller than the discharge current discharged from the gate when the absolute value of the upper arm off voltage deviation ΔSHoff is small. In other word, the switching speed when the absolute value of the upper arm off voltage deviation ΔSHoff is large, becomes lower than the switching speed when the absolute value of the upper arm off voltage deviation ΔSHoff is small.

The upper arm drive circuit DrH is provided with a first current detecting unit 46 and a first gate voltage detecting unit 47. The first current detecting unit 46 detects the current flowing through the upper arm switch SWH and the upper arm diode DH. The detection value of the first current detecting unit 46 is transmitted to the first adjusting unit 42. The first gate voltage detecting unit 47 detects the gate voltage of the upper arm switch SWH to be the upper arm gate voltage VgsH. The detecting value of the first gate voltage detecting unit 47 is transmitted to the first adjusting unit 42.

Subsequently, the lower arm drive circuit DrL will be described. According to the present embodiment, the configuration of the lower arm drive circuit DrL is basically the same as the configuration of the upper arm drive circuit DrH. Hence, an explanation of the lower arm drive circuit DrL will be appropriately omitted.

The lower arm drive circuit DrL is provided with a second buffer circuit 60 and a second gate resistor 61. The second gate resistor 61 is configured to have a variable resistance. The second buffer circuit 60 acquires the lower arm drive signal SGL from the control unit 30, and supplies charge current to the gate of the lower arm switch SWL via the second gate resistor 61, when the acquired lower arm drive signal SGL indicates the ON command. Thus, the gate voltage of the lower arm switch SWL becomes a value larger than or equal to the threshold voltage Vth, and the lower arm switch SWL turns ON. On the other hand, the second buffer circuit 60 discharges the discharge current from the gate of the lower arm switch SWL via the second gate resistor 61, when the acquired lower arm drive signal SGL indicates the OFF command. Thus, the gate voltage of the lower arm switch SWL becomes a value less than the threshold voltage Vth and the lower arm switch SWL turns OFF.

The lower arm drive circuit DrL is provided with a second adjusting unit 62, a second capacitor 63, a second surge voltage detecting unit 64 and a second OFF deviation calculation unit 65. The second capacitor 63 is connected in parallel to the lower arm switch SWL. The second surge voltage detecting unit 64 detects, based on the voltage across the terminals of the second capacitor 63, a surge voltage produced in response to the lower arm switch SWL switching to the OFF state (e.g. peak value of the surge voltage) to be the lower arm surge voltage VsL. Note that the second surge voltage detecting unit 64 may detect a value in which the voltage across the terminals of the smoothing capacitor 22 is subtracted from the above-described surge voltage (e.g. peak value of the above-described surge voltage) to be the lower arm surge voltage VsL.

The second OFF deviation calculation unit 65 subtracts the detected lower arm surge voltage VsL from the off surge command value Vsoff, thereby calculating the lower arm OFF voltage deviation ΔSLoff. The second adjusting unit 62 adjusts, based on the calculated lower arm OFF voltage deviation ΔSLoff, the resistance of the first gate resistor 41 at a time when the lower arm switch SWL is turned OFF.

The lower arm drive circuit DrL is provided with a second current detecting unit 66 and a second voltage detecting unit 67. The second current detecting unit 66 detects current flowing through lower arm switch SWL and the lower arm diode DL. The detection value of the second current detecting unit 66 is transmitted to the second adjusting unit 62. The second gate voltage detecting unit 67 detects the gate voltage of the lower arm switch SWL to be the lower arm gate voltage VgsL. The detection value of the second gate voltage detecting unit 67 is transmitted to the second adjusting unit 62.

Subsequently, a masking process executed by the first adjusting unit 42 and the second adjusting unit 62 will be described. In the present embodiment, the first adjusting unit 42 and the second adjusting unit 62 includes the mask processing unit. Hereinafter, the second adjusting unit 62 will be exemplified for the masking process.

Figure 3A:
FIGS. 3A to 3D are a set of timing diagrams showing an off-masking period.
Figure 3B:
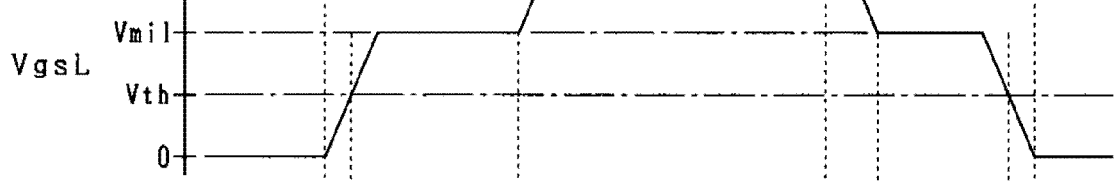
Figure 3C:
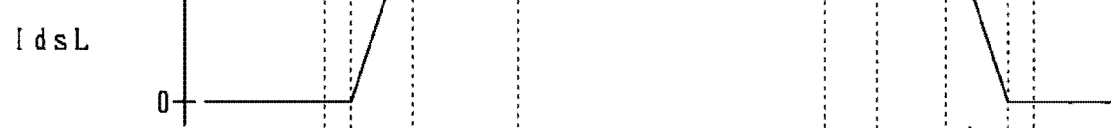
Figure 3D:
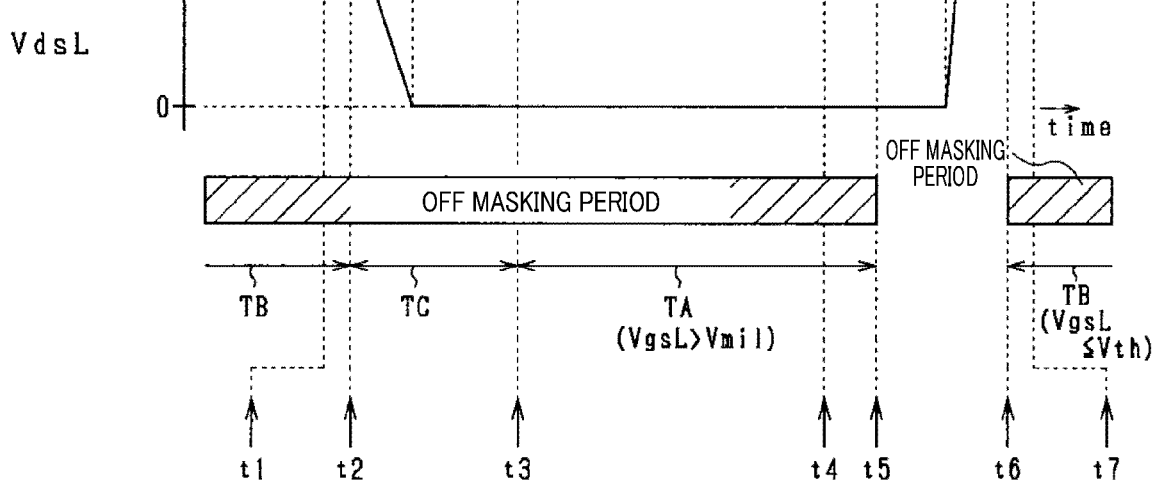

In the case where the lower arm switch SWL is turned OFF, the second adjusting unit 62 utilizes the lower arm surge voltage VsL detected during the lower arm off detecting period for adjusting the resistance of the second gate resistor 61. In the present embodiment, the lower arm off detecting period (time t5 to t6 shown in FIGS. 3A to 3D) refers to a period where the lower arm gate voltage VgsL is higher than the threshold voltage Vth and lower than or equal to the Millerc Vmil, in a period where the lower arm drive signal SGL indicates OFF command. The lower arm off detecting period includes a period where a surge voltage is produced in response to the lower arm switch SWL switching to the OFF state. FIG. 3A illustrates a change in the lower arm drive signal SGL to be transmitted to the lower arm drive circuit DrL. FIG. 3B illustrates a change in the lower arm gate voltage VgsL detected by the second gate voltage detecting unit 67. FIG. 3C illustrates a change in the drain current IdsL flowing through the lower arm switch SWL. FIG. 3D illustrates a change in the source-drain voltage VdsL of the lower arm switch SWL.

At time t1 shown in FIGS. 3A to 3D, the lower arm drive signal SGL is switched to ON command. Hence, with a process executed by the second adjusting unit 62, the charge current is supplied to the gate of the lower arm switch SWL. As a result, the lower arm gate voltage VgsL start to increase.

Thereafter, at time t2, the lower arm gate voltage VgsL reaches the threshold voltage Vth. Hence, the drain current IdsL starts to flow. Then, the lower arm gate voltage VgsL continues to increase, and the lower arm gate voltage VgsL becomes the Miller voltage Vmil. Then, at time t3, the lower arm gate voltage VgsL starts to increase from the Miller voltage Vmil, and the lower arm gate voltage VgsL starts to increase until reaching the upper limit value.

Thereafter, at time t4, the lower arm drive signal SGL is switched to the OFF command. Hence, with a process executed by the second adjusting unit 62, the discharge current is discharged from the gate of the lower arm switch SWL. As a result, the lower arm gate voltage VgsL start to decrease. Then, at time t5, the lower arm gate voltage VgsL decreases to the Miller voltage Vmil. Thereafter, at time t6, the lower arm gate voltage VgsL decreases to the threshold voltage Vth. Then, at time t7, the lower arm gate voltage VgsL becomes 0.

Here, the second adjusting unit 62 sets a period other than the lower arm off detecting period to be the lower arm off masking period. The second adjusting unit 62 performs a masking process for the voltage detected in the lower arm off masking period by the second surge voltage detecting unit 64, which is not used for adjusting the resistance of the second resistor 61. The lower arm off masking period refers to a period in the adjusting process for the resistance of the second gate resistor 61 in which the surge voltage detected by the second surge voltage detecting unit 64 is invalidated. The lower arm off masking period refers to a period combining a period where the lower arm gate voltage VgsL is lower than or equal to the threshold Vth (TB shown in FIGS. 3A to 3D), a period where the lower arm gate voltage VgsL is higher than the Miller voltage Vmil (TA shown in FIGS. 3A to 3D) and a period where the lower arm drive signal SGL indicates ON command during the lower arm gate voltage VgsL being larger than the threshold Vth and lower than or equal to the Miller voltage Vmil (TC shown in FIGS. 3A to 3D).

Since the drain current already shows 0 during the period of TB, no surge voltage is assumed to be produced in this period. The period of TB is set in the lower arm off masking period, whereby erroneous detection of the lower arm surge voltage VsL caused by the upper arm switch SWH switching to the ON state can be suppressed.

The period of TA refers to a period before the drain current starts to decrease since the switching state is not changed. Hence in the period of TA, no surge voltage is assumed to be produced. Since the period of TC is a period where the lower arm switch SWL is switched to the ON state, it is assumed that no surge voltage is produced in response to the lower arm switch SWL switching to the OFF state.

According to the masking process of the second adjusting unit 62, the lower arm surge voltage VsL detected in the off detecting period is utilized for adjusting the switching speed, and the lower arm surge voltage VsL detected in the lower arm off mask period is invalidated. Hence, erroneous detection of the lower arm surge voltage VsL utilized for adjusting the switching speed can be suppressed. Thus, the switching speed is prevented from being significantly deviated from the appropriate switching speed when the lower arm switch SWL is switched to the OFF state, and erroneous detection of the lower arm drive circuit DrL can be suppressed. As a result, deterioration in the reliability of the lower arm switch SWL can be avoided.

Note that the masking process of the first adjusting unit 42 is the same as the masking process of the second adjusting unit 62. In the case where the upper arm switch SWH is turned OFF, the first adjusting unit 42 utilizes the upper arm surge voltage VsH detected during the upper arm off detecting period for adjusting the resistance of the first gate resistor 41. According to the present embodiment, the upper arm off detecting period refers to a period where the upper arm gate voltage VgsH is higher than the threshold Vth and lower than or equal to the Miller voltage Vmil, in the period where the upper arm drive signal SGH indicates an OFF command. The upper arm off detecting period includes a period where a surge voltage occurs in response to the upper arm switch SWH switching to the OFF state.

The first adjusting unit 42 determines a period other than the upper arm off detecting period to be an upper arm off masking period. The second adjusting unit 62 performs a masking process for the voltage detected in the upper arm off masking period by the first surge voltage detecting unit 44, which is not used for adjusting the resistance of the first resistor 41. The upper arm off masking period refers to a period combining a period where the upper arm gate voltage VgsH is lower than or equal to the threshold Vth, a period where the upper arm gate voltage VgsH is higher than the Miller voltage Vmil and a period where the upper arm drive signal SGH indicates ON command during the upper arm gate voltage VgsH being larger than the threshold Vth and lower than or equal to the Miller voltage Vmil.

According to the masking process of the first adjusting unit 42, an erroneous detection of the upper arm surge voltage VsH used for adjusting the switching speed of the upper arm switch SWH can be suppressed. Thus, the switching speed is prevented from being significantly deviated from the appropriate switching speed when the upper arm switch SWH is switched to the OFF state, and an erroneous detection of the upper arm drive circuit DrH can be suppressed. As a result, a deterioration in the reliability of the upper arm switch SWH can be avoided.

Modifications of the first embodiment will be described as follows.

The lower arm off masking period may be set to be any one or two of the periods TA, TB and TC shown in FIGS. 3A to 3D. For example, a period in which the period TC is subtracted from the lower arm off masking period described in the first embodiment may be set to be the lower arm off masking period. Note that the upper arm off masking period is the same as that of the lower arm off masking period described above.

Second Embodiment

Figure 4A:
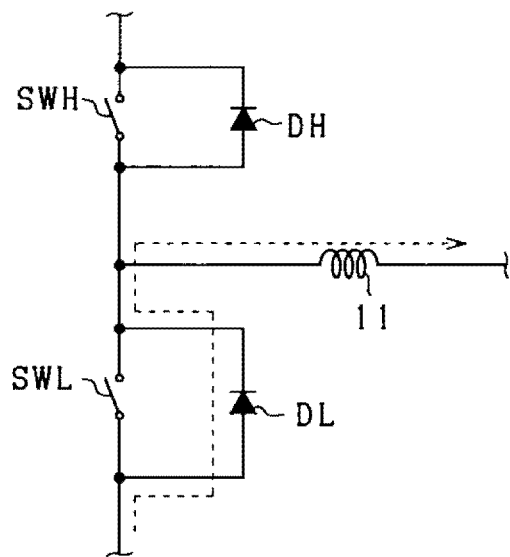
FIGS. 4A and 4B are diagrams showing a state where a recovery current flows and a state where a recovery current does not flow according to a second embodiment.

Hereinafter, for the second embodiment, different points from the first embodiment will mainly be described with reference to the drawings. According to the present embodiment, as shown in FIG. 4A, the second adjusting unit 62 sets a period determined that a reflux current is flowing through the lower arm diode DL to be a lower arm off masking period. In other words, as shown in FIGS. 5A to 5D, the second adjusting unit 62 prevents the lower arm surge voltage VsL from being used for adjusting the resistance of the second gate resistor 61 during a period determined that the reflux current is flowing. In the case where the reflux current is flowing, even when the lower arm switch SWL is switched to the OFF state, a surge voltage in response to the switching to the OFF state is not produced. Hence, according to the present embodiment, erroneous detection of the lower arm surge voltage VsL can be appropriately avoided. Note that the second adjusting unit 62 may determine whether the reflux current is flowing in accordance with the detection value of the second current detecting unit 66 or the phase current detecting unit 23. FIGS. 5A to 5D correspond to the above-described FIGS. 3A to 3D.

Figure 4B:
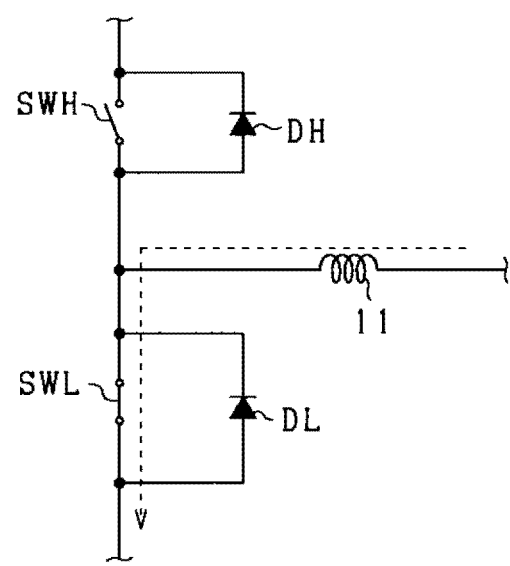
Figure 5A:
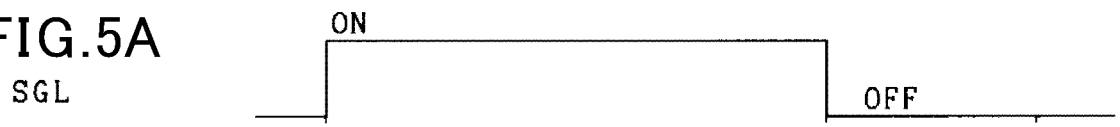
FIGS. 5A to 5D are a set of timing diagrams showing an off-masking period.
Figure 5B:
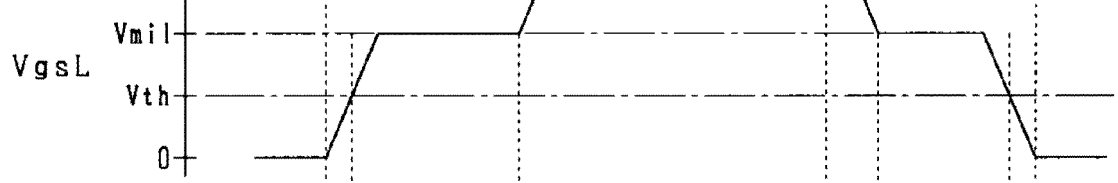
Figure 5C:
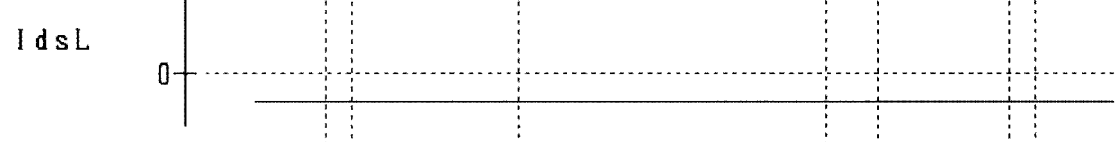
Figure 5D:
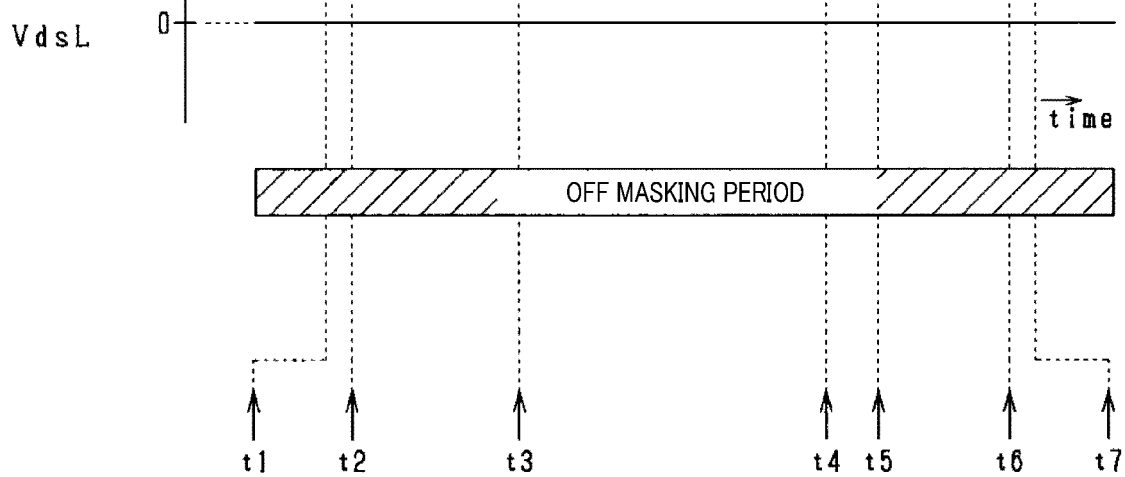

On the other hand, as shown in FIG. 4B, the second adjusting unit 62 performs the masking process described in the first embodiment in a period where the reflux current is not flowing through the lower arm diode DL.

The first adjusting unit 42 sets a period where the reflux current is flowing through the upper arm diode DH to be the upper arm off masking period. In other words, the first adjusting unit 42 prevents the upper arm surge voltage VsH from being used for adjusting the resistance of the first gate resistor 41 during a period determined that the reflux current is flowing. Note that the first adjusting unit 42 may determine whether the reflux current is flowing based on the detection value of the first current detecting unit 46 or the phase current detecting unit 23.

On the other hand, the first adjusting unit 42 performs the masking process described in the first embodiment in a period where the reflux current is not flowing through the upper arm diode DH.

Modifications of the second embodiment will be described as follows.

As shown in FIGS. 6A to 6D, the second adjusting unit 62 may determine a part of a period where the reflux current is flowing through the lower arm diode DL to be the lower arm off masking period without setting the entire period where the reflux current is flowing through the lower arm diode DL to be the lower arm off masking period. FIGS. 6A to 6D illustrates an example in which a part of the period from a time t5 to a time t6 is not set to be the lower arm off masking period. Even in this case, the lower arm off masking period in the case where the reflux current is flowing is set to be longer than that in the case where the reflux current is not flowing. FIGS. 6A to 6D correspond to FIGS. 5A to 5D described above. Note that the same applies to the first adjusting unit 42.

Third Embodiment

Figure 7:
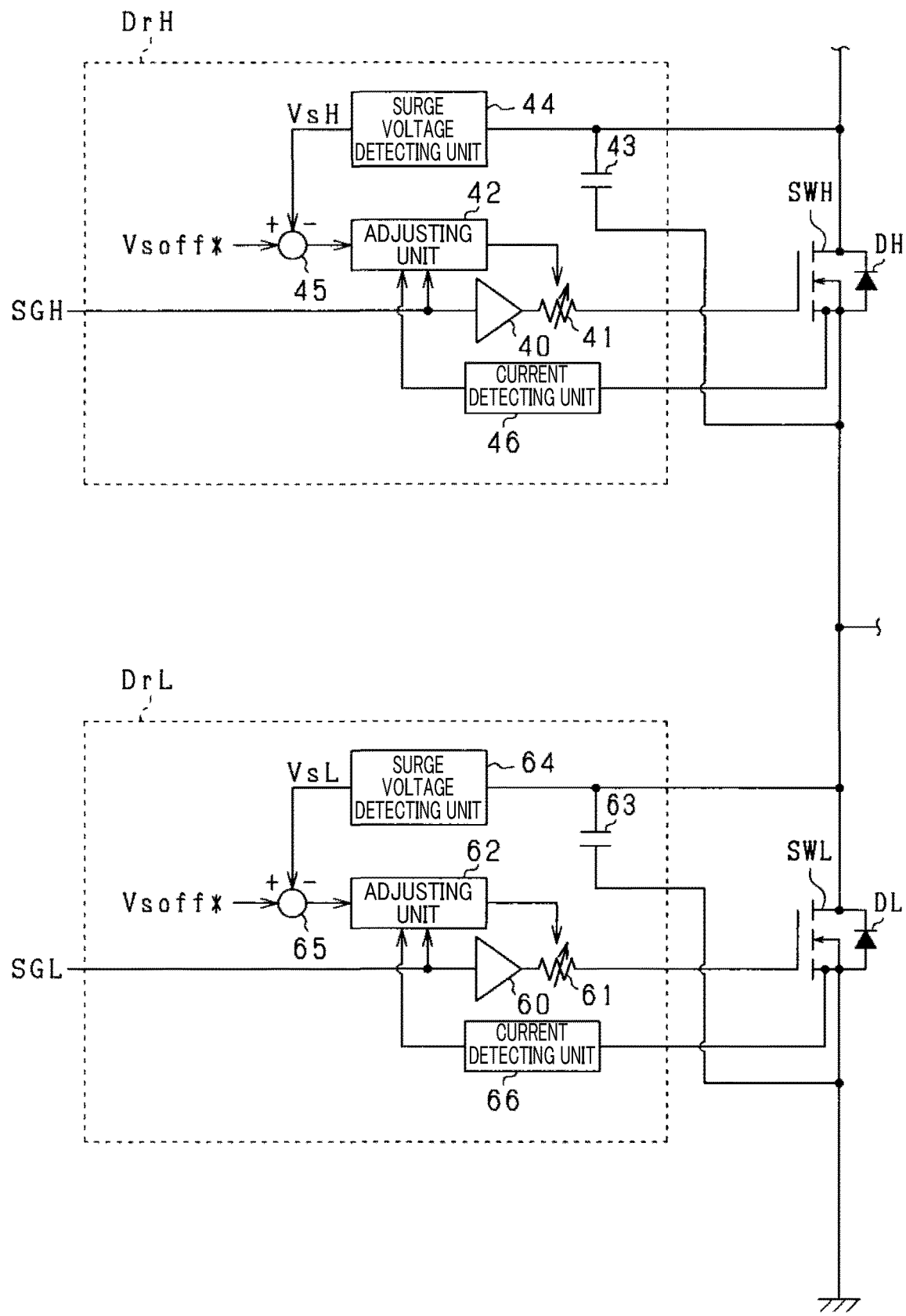
FIG. 7 is a diagram showing a configuration of a drive circuit according to a third embodiment.

Hereinafter, for the third embodiment, different points from the first embodiment will mainly be described with reference to the drawings. According to the present embodiment, as shown in FIG. 7, the lower arm drive circuit DrL is not provided with the second voltage detecting unit 67, and the upper arm drive circuit DrH is not provided with the first gate voltage detecting unit 47. In FIG. 7, for the configurations same as those shown in FIG. 2, the same reference numbers are applied.

As shown in FIGS. 8A to 8D, the second adjusting unit 62 sets a period where the lower arm drive signal SGL indicates the ON command to be the lower arm off masking period. FIGS. 8A to 8D correspond to the above FIGS. 3A to 3D.

The first adjusting unit 42 sets a period where the upper arm drive signal SGH indicates the ON command to be the upper arm off masking period.

According to the present embodiment as described above, the masking process can be performed without monitoring the gate voltage. Accordingly, the configuration of the drive circuit can be simplified.

Fourth Embodiment

Hereinafter, for the fourth embodiment, different points from the first embodiment will mainly be described with reference to the drawings. According to the present embodiment, the resistance of the first gate resistor 41 when the upper arm switch SWH is turned to ON state, and the resistance of the second gate resistor 61 when the lower arm switch SWL is turned to ON state are adjusted.

Figure 9:
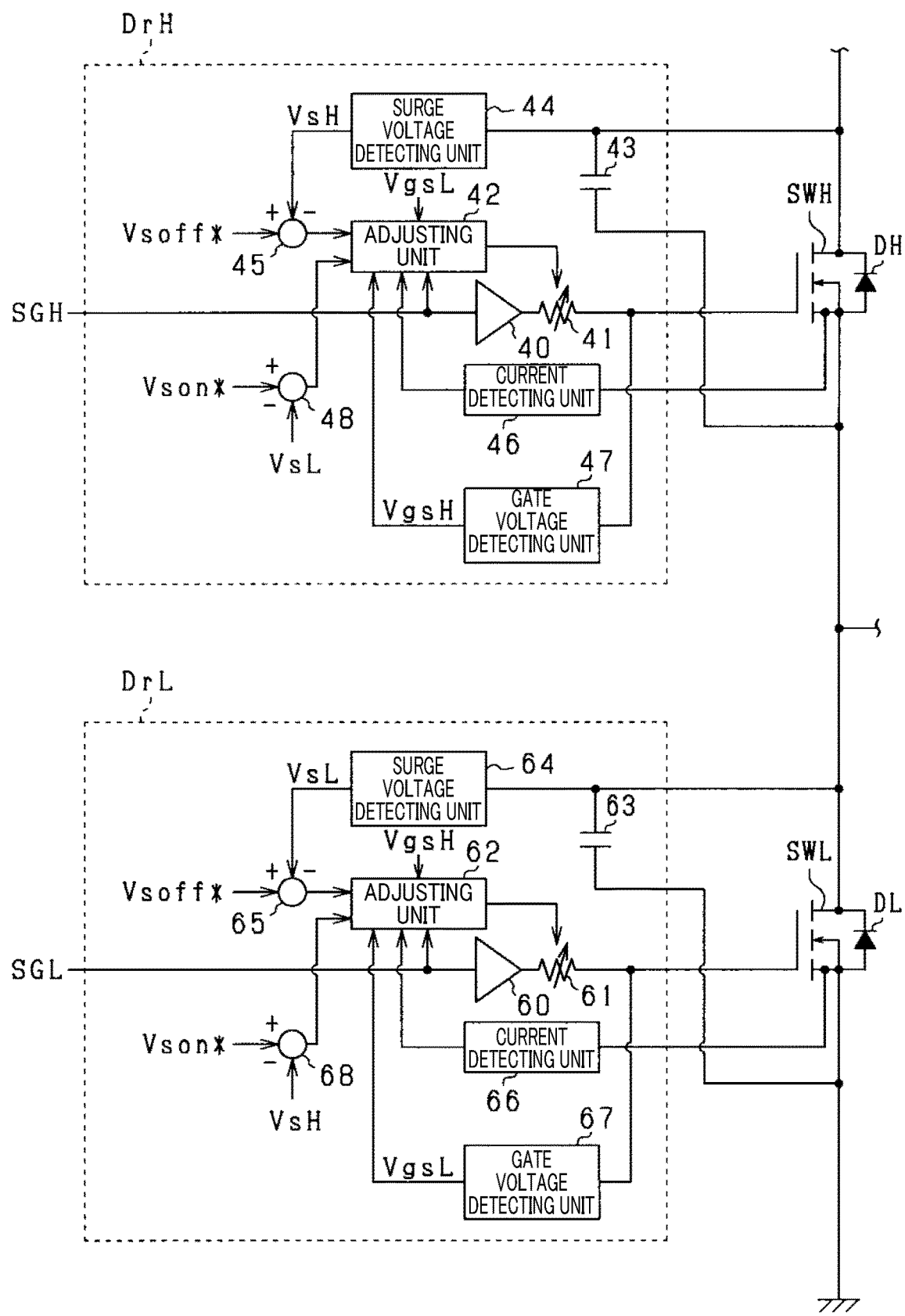
FIG. 9 is a diagram showing a drive circuit according to a fourth embodiment.

FIG. 9 illustrates the drive circuit according to the present embodiment. In FIG. 9, for the configurations same as those shown in FIG. 2, the same reference numbers are applied.

Figure 10A:
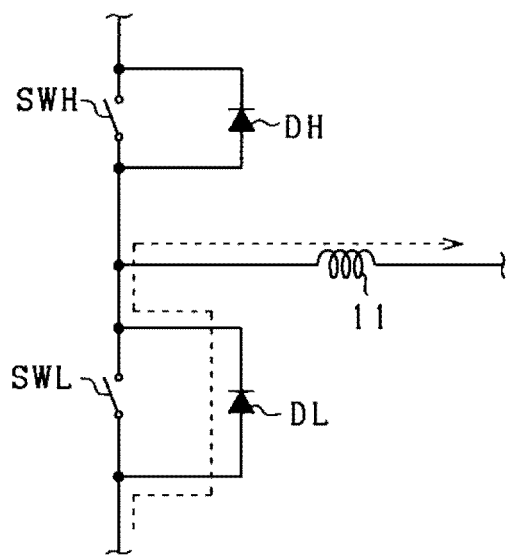
FIGS. 10A and 10B are diagrams showing a state where the terminal voltage of the lower arm switch is detected as a lower arm surge voltage.
Figure 10B:
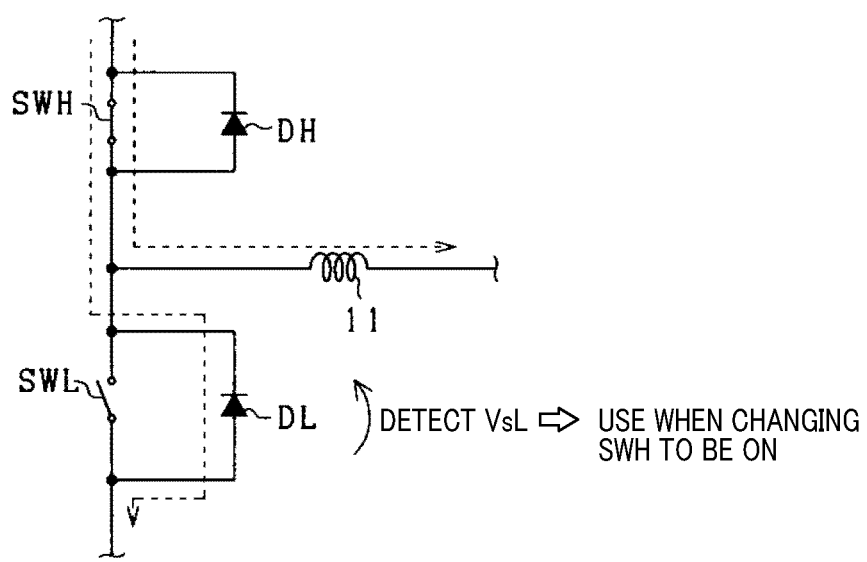

According to the present embodiment, the upper arm drive circuit DrH and the lower arm drive circuit DrL are configured such that the various information such as the detected gate voltage, the detected surge voltage and the drive signal is transmittable. The upper arm drive circuit DrH is provided with a first ON deviation calculation unit 48. The first ON deviation calculation unit 48 acquires the lower arm surge voltage VsL detected by the second surge voltage detecting unit 64 from the lower arm drive circuit DrL, and subtracts the acquired lower arm surge voltage VsL from the ON surge command value Vson*, thereby calculating the upper arm ON voltage deviation $\Delta$Shon. The lower arm surge voltage VsL used for the calculation refers to a surge voltage produced in response to the upper arm switch SWH switching to the ON state shown in FIG. 10B from the deadtime in which the both of the upper arm switch SWH and the lower arm switch SWL are in OFF states shown in FIG. 10A. The reason why the surge voltage is produced in response to the upper arm switch SWH switching to the ON state is that a reverse voltage is applied to the lower arm diode DL and then the recovery current flows through the lower arm diode DL.

The first adjusting unit 42 corresponds to an upper arm adjusting unit. The first adjusting unit 42 adjusts, based on the calculated upper arm ON voltage deviation $\Delta$Shon, the resistance of the first gate resistor 41 when the upper arm switch SWH is switched to the ON state in the next cycle. According to the present embodiment, the adjusting process based on the upper arm ON voltage deviation $\Delta$Shon corresponds to an upper arm processing unit.

For example, the first adjusting unit 42 sets, in the case where the upper arm ON voltage deviation $\Delta$Shon is smaller than 0, the resistance when the absolute value of the upper arm ON voltage deviation $\Delta$Shon is large, to be larger than the resistance when the absolute value of the upper arm ON voltage deviation $\Delta$Shon is small. Thus, the charge current supplied to the gate when the absolute value of the upper arm ON voltage deviation $\Delta$Shon is larger, becomes smaller than the charge current supplied to the gate when the absolute value of the upper arm ON voltage deviation $\Delta$Shon is small.

Figure 11A:
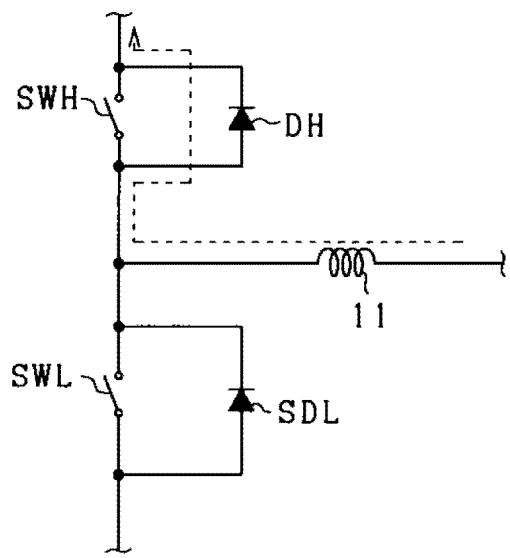
FIGS. 11A and 11B are diagrams showing a state where the terminal voltage of the upper arm switch is detected as an upper arm surge voltage.
Figure 11B:
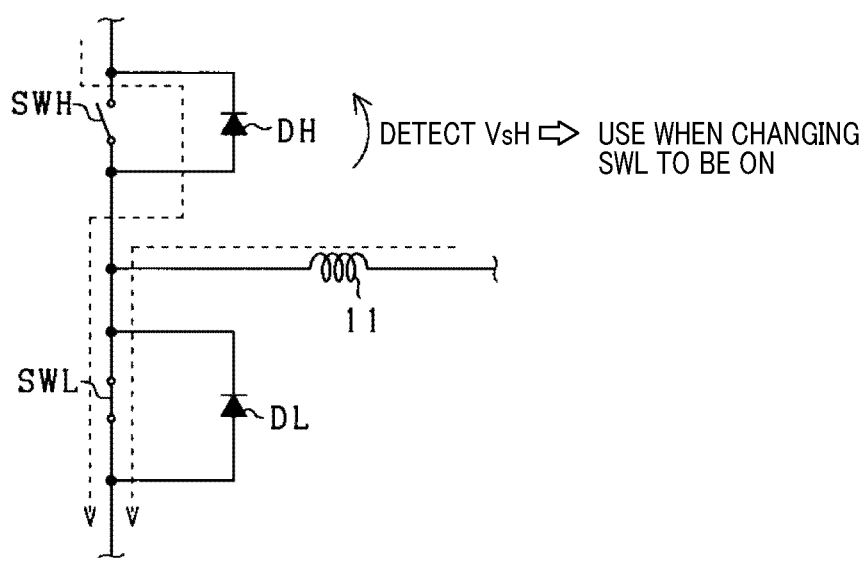

The lower arm drive circuit DrL is provided with a second ON deviation calculation unit 68. The second ON deviation calculation unit 68 acquires the upper arm surge voltage VsH detected by the first surge voltage detecting unit 44 from the upper arm drive circuit DrH, and subtracts the acquired upper arm surge voltage VsH from the ON surge command value Vson*, thereby calculating the lower arm ON voltage deviation $\Delta$Shon. The upper arm surge voltage VsH used for the calculation refers to a surge voltage produced in response to the lower arm switch SWL switching to the ON state shown in FIG. 11B from the deadtime in which the both of the upper arm switch SWH and the lower arm switch SWL are in OFF states shown in FIG. 11A. The reason why the surge voltage is produced in response to the lower arm switch SWL switching to the ON state, is that a reverse voltage is applied to the upper arm diode DH and then the recovery current flows through the upper arm diode DH.

The second adjusting unit 62 corresponds to a lower arm adjusting unit. The second adjusting unit 62 adjusts, based on the calculated lower arm ON voltage deviation $\Delta$Shon, the resistance of the second gate resistor 61 when the lower arm switch SWL is switched to the ON state in the next cycle. According to the present embodiment, the adjusting process based on the lower arm ON voltage deviation $\Delta$Shon corresponds to a lower arm processing unit.

With reference to FIGS. 12A to 12D, a masking process according to the present embodiment will be described. FIG. 12A shows a change in the upper arm drive signal SGH, FIG. 12B shows a change in the upper arm gate voltage VgsH, FIG. 12C shows a change in the lower arm drive signal SGL, and FIG. 12D shows a change in the lower arm gate voltage VgsL. Note that FIGS. 12A to 12D show both of the upper arm off masking period and the lower arm off masking periods.

At time t1, the upper arm drive signal SGH is switched to the ON command. Thus, the upper arm gate voltage VgsH start to increase from 0. Thereafter, at time t2, the upper arm drive signal SGH is switched to the OFF command. Thus, the upper arm gate voltage VgsH starts to decrease. According to the present embodiment, the second adjusting unit 62 of the lower arm drive circuit DrL sets a period from t1 to t3 where the upper arm gate voltage VgsH is higher than 0 to be the upper arm on masking period. The second adjusting unit 62 does not use the voltage detected by the first surge voltage detecting unit 44 in the upper arm on masking period for adjusting the resistance of the second gate resistor 61 in the case where the lower arm switch SWL is switched to the ON state in the next cycle. The second adjusting unit 62 utilizes the voltage detected by the first surge voltage detecting unit 44 in a period other than the upper arm on masking period for adjusting the resistance of the second gate resistor 61 when the lower arm switch SWL is switched to the ON state in the next cycle. Thus, an erroneous detection of the upper arm surge voltage VsH used for adjusting the switching speed when the lower arm switch SWL is switched to the ON state can be suppressed. As a result, erroneous operation of the lower arm drive circuit DrL can be suppressed. Note that a period from time t7 to t8 shown in FIGS. 12A to 12D is also determined as an upper arm on masking period.

At time t4, the lower arm drive signal SGL is switched to the ON command. Thus, the lower arm gate voltage VgsL starts to increase from 0. Thereafter, at time t5, the lower arm drive signal SGL is switched to the OFF command. Thus, the lower arm gate voltage Vgsl starts to decrease. According to the present embodiment, the first adjusting unit 42 of the upper arm drive circuit DrH sets a period from time t4 to time t6 where the lower arm gate voltage Vgsl is higher than 0 to be a lower arm on masking period. The first adjusting unit 42 does not use the voltage detected by the second surge voltage detecting unit 64 in the lower arm on masking period for adjusting the resistance of the first gate resistor 41 in the case where the upper arm switch SWH is switched to the ON state in the next cycle. Thus, an erroneous detection of the lower arm surge voltage VsL used for adjusting the switching speed when the upper arm switch SWH is switched to the ON state can be suppressed. As a result, erroneous operation of the upper arm drive circuit DrH can be suppressed. Note that a period from time t9 to t10 shown in FIGS. 12A to 12D is also determined as a lower arm on masking period.

Modifications of the fourth embodiment will be described as follows.

The configuration of the second embodiment may be applied to the fourth embodiment. In this case, the second adjusting unit 62 may set a period where the reflux current is flowing through the upper arm diode DH to be the upper arm on masking period. Further, the first adjusting unit 42 may set a period where the reflux current is flowing through the lower arm diode DL to be the lower arm on masking period.

A configuration, in which the switching speed is adjusted when the upper/lower switches SWH and SWL are switched to OFF states, may not be provided in the upper/lower arm drive circuits DrH and DrL.

The second adjusting unit 62 may set a period where the upper arm drive signal SGH indicates the ON command to be the upper arm on masking period. In FIGS. 13A to 13D, a period from time t1 to time t2 and a period from time t5 to time t6 each corresponds to an upper arm on masking period. FIGS. 13A to 13D correspond to the above-described FIGS. 12A to 12D.

Also, the first adjusting unit 42 may set a period where the lower arm drive signal SGL indicates the ON command to be the lower arm on masking period. In FIGS. 13A to 13D, a period from a time t3 to time t4 and a period from time t7 to time t8 each corresponds to the lower arm on masking period.

Other Embodiments

The above-described respective embodiments may be modified as follows.

The upper arm drive circuit DrH may be provided with, instead of the first capacitor 43, for example, a pair of series-connected capacitors which are connected in parallel to the upper arm switch SWH, or a pair of series-connected resistors which are connected in parallel to the upper arm switch SWH. In this case, the first surge voltage detecting unit 44 may detect the surge voltage based on the divided voltage of the pair of series-connected capacitors or the pair of series-connected resistors. Note that the same applies to the lower arm drive circuit DrL.

As an adjusting method of the switching speed, it is not limited to the method of adjusting the gate resistor. For example, by adjusting the voltage of the power source that supplies voltage to the gate, the switching speed may be adjusted. Also, in the case where a constant current control is performed causing the gate charged at the constant current or discharged at the constant current, the switching speed may be adjusted by adjusting an amount of the constant current.

According to the above-described respective embodiments, the upper arm drive circuit DrH and the lower arm drive circuit DrL are provided individually. However, it is not limited thereto. The upper and the lower drive circuits DrH and DrL may be integrated.

As switches included in the inverter, it is not limited to MOSFET but may be IGBT, for example. In this case, free-wheel diode may be connected in reverse-parallel to the IGBT. In this case, the collector corresponds to a first main terminal and the emitter corresponds to a second main terminal.

As an inverter, it is not limited to three-phase inverter but may be configured as a two-phase inverter including a series-connected bodies of the lower arm switches corresponding to the number of phases, or configured as four or more phase inverter. For example, in the case of two-phase inverter, the connection point between the upper arm switch and the lower arm switch of pair of circuits which are mutually connected in series, and the connection point between the upper arm switch and the lower arm switch of the second pair of circuits which are mutually connected in series, are connected via an inductive load (e.g. winding).

The present disclosure is described in accordance with embodiments. However, it is realized that the present disclosure is not limited to the embodiments and structures thereof. The present disclosure may include various modification examples and equivalent thereof. Further, various combinations and modes and other combinations or modes which includes a single element or more elements or less in the various combinations and the modes are within the scope and the spirit of the present disclosure.

CONCLUSION

The present disclosure provides a switch drive circuit capable of suppressing occurrence of an erroneous operation of the drive circuit.

As one aspect, the present disclosure is provided with a switch drive circuit that drives a switch including a surge detecting unit that detects a surge voltage produced in response to a change in a switching state of the switch; an adjusting unit that adjusts, based on the surge voltage detected by the surge detecting unit, a switching speed of the switch when changing the switching state of the switch; and a mask processing unit that prevents a voltage from being detected by the surge voltage detecting unit in a period other than a period where the surge voltage is assumed to be produced in response to a change in the switching state of the switch, to prevent it from being used by the adjusting unit for adjusting the switching speed.

According to the present disclosure, the configuration prevents detection of a voltage by the surge voltage detecting unit in a period other than a period where the surge voltage is assumed to be produced in response to a change in the switching state of the switch, from being used by the adjusting unit for adjusting the switching speed. Hence, erroneous detection of the surge voltage can be suppressed and further, erroneous operation of the drive circuit can be suppressed.

What is claimed is:

1. A switch drive circuit that drives a switch comprising:
   a surge detecting unit that detects a surge voltage produced in response to a change in a switching state of the switch;
   an adjusting unit that adjusts, based on the surge voltage detected by the surge detecting unit, a switching speed of the switch when changing the switching state of the switch; and
   a mask processing unit that prevents a voltage, detected by the surge voltage detecting unit in a period other than a period where the surge voltage is assumed to be produced in response to a change in the switching state of the switch, from being used by the adjusting unit for adjusting the switching speed, wherein:
   the surge detecting unit is configured to detect a surge voltage produced in response to the switch changing to an OFF state,
   the adjusting unit is configured to adjust, based on the surge voltage detected by the surge detecting unit, a switching speed of the switch when the switch is changing to the OFF state, and
   the mask processing unit is configured to prevent, based on a gate voltage of the switch, the surge voltage detected by the surge detecting unit from being used by the adjusting unit for adjusting the switching speed when the switch is changing to the OFF state.

2. The switch drive circuit according to claim 1, wherein the mask processing unit is configured to prevent the surge voltage detected by the surge detecting unit in a period where the gate voltage of the switch is higher than a Miller voltage thereof, from being used by the adjusting unit for adjusting the switching speed when the switch is changing to the OFF state.

3. The switch drive circuit according to claim 2, wherein the mask processing unit is configured to prevent a surge voltage, detected by the surge detecting unit in a period where an ON command is applied to the switch during a period where the gate voltage of the switch is less than or equal to the Miller voltage, from being used by the adjusting unit for adjusting the switching speed when the switch is changing to the OFF state.

4. The switch drive circuit according to claim 1, wherein the mask processing unit is configured to prevent a surge voltage, detected by the surge detecting unit in a period where the gate voltage is less than or equal to a threshold thereof, from being used by the adjusting unit for adjusting the switching speed when the switch is changing to the OFF state.

5. The switch drive circuit according to claim 1, wherein the surge voltage detecting unit is configured to detect a surge voltage produced in response to the switching changing to the OFF state;
the adjusting unit is configured to adjust, based on the surge voltage detected by the surge detecting unit, a switching speed of the switch when the switch is changing to the OFF state; and
the mask processing unit is configured to prevent a surge voltage detected by the surge detecting unit in a period where an ON command is applied to the switch during a period where the gate voltage of the switch is less than or equal to the Miller voltage, from being used by the adjusting unit for adjusting the switching speed when the switch is changing to the OFF state.

6. The switch drive circuit according to claim 1, wherein the switch is configured of an upper arm switch and a lower arm switch which are mutually connected in series;
the surge detecting unit includes a lower arm detecting unit that detects, based on a voltage across terminals of the lower arm switch, a surge voltage produced in response to the upper arm switch changing to an ON state in a state where both of the lower arm switch and the upper arm switch are in an OFF state, and an upper arm detecting unit that detects, based on a voltage across terminals of the upper arm switch, a surge voltage produced in response to the lower arm switch changing to an ON state in a state where both of the lower arm switch and the upper arm switch are in an OFF state;
the adjusting unit includes an upper arm adjusting unit that adjusts, based on a surge voltage detected by the lower arm detecting unit, a switching speed of the upper arm switch when changing to an ON state in a next cycle, and a lower arm adjusting unit that adjusts, based on a surge voltage detected by the upper arm detecting unit, a switching speed of the lower arm switch when changing to an ON state in a next cycle; and
the mask processing unit includes an upper arm processing unit that prevents a voltage, detected by the lower arm detecting unit in a period where a gate voltage of the lower arm switch is higher than 0 or an ON command is applied to the lower arm switch, from being used by the upper arm adjusting unit for adjusting the switching speed when the upper arm switch is changing to an ON state, and a lower arm processing unit that prevents a voltage detected by the upper arm detecting unit in a period where a gate voltage of the upper arm switch is higher than 0 or an ON command is applied to the upper arm switch, from being used by the lower arm adjusting unit for adjusting the switching speed when the lower arm switch is changing to an ON state.

7. The switch drive circuit according to claim 1, wherein the switch includes a diode connected in parallel thereto; and
the mask processing unit is configured to set, when determined that a reflux current is flowing through the diode, a period where the surge voltage detected by the surge detecting unit is not used by the adjusting unit for adjusting the switching speed to be longer than that of a case when determined that the reflux current is not flowing through the diode.

8. The switch drive circuit according to claim 1, wherein the surge detecting unit detects the surge voltage using a capacitor connected to the surge detecting unit.

* * * * *